(12) United States Patent
Jin et al.

(10) Patent No.: US 8,777,633 B2
(45) Date of Patent: Jul. 15, 2014

(54) ROTATABLE DATA CARD

(71) Applicant: Huawei Device Co., Ltd., Shenzhen (CN)

(72) Inventors: Linfang Jin, Shenzhen (CN); Yaming Jiang, Wuhan (CN)

(73) Assignee: Huawei Device Co., Ltd., Shenzhen (CN)

( * ) Notice: Subject to any disclaimer, the term of this patent is extended or adjusted under 35 U.S.C. 154(b) by 85 days.

(21) Appl. No.: 13/693,514

(22) Filed: Dec. 4, 2012

(65) Prior Publication Data

US 2013/0095677 A1 Apr. 18, 2013

Related U.S. Application Data

(63) Continuation of application No. PCT/CN2011/075436, filed on Jun. 8, 2011.

(30) Foreign Application Priority Data

Jun. 11, 2010 (CN) .................... 2010 2 0231187 U

(51) Int. Cl.
*H01R 39/00* (2006.01)
(52) U.S. Cl.
USPC ........................................................ 439/11
(58) Field of Classification Search
USPC ............................................... 439/11, 13–30
See application file for complete search history.

(56) References Cited

U.S. PATENT DOCUMENTS

| | | | | |
|---|---|---|---|---|
| 6,095,620 | A * | 8/2000 | Dillard et al. ............... | 303/11 |
| 6,612,874 | B1 * | 9/2003 | Stout et al. ................. | 439/640 |
| 6,695,620 | B1 * | 2/2004 | Huang .......................... | 439/11 |
| 6,908,324 | B1 * | 6/2005 | Morley et al. ............... | 439/218 |
| 7,494,343 | B2 * | 2/2009 | Schriefer .................... | 439/11 |
| 7,824,186 | B2 * | 11/2010 | Zhao et al. ................... | 439/13 |
| 8,011,930 | B2 * | 9/2011 | Lee et al. .................... | 439/18 |

(Continued)

FOREIGN PATENT DOCUMENTS

| | | |
|---|---|---|
| CN | 201064050 | 5/2008 |
| CN | 101609953 | 12/2008 |

(Continued)

OTHER PUBLICATIONS

International Search Report of Corresponding PCT Application PCT/CN2011/075436 mailed Sep. 15, 2011.

(Continued)

*Primary Examiner* — Gary Paumen
(74) *Attorney, Agent, or Firm* — Staas & Halsey LLP

(57) ABSTRACT

An embodiment of the present invention discloses a rotatable data card. The rotatable data card includes a data card body, a USB connector, and a rotating shaft assembly. The rotating shaft assembly includes a rotating shaft, a fixed fluted disk, and a rotating shaft casing. The rotating shaft and the fixed fluted disk are accommodated in the rotating shaft casing. Teeth are set on the rotating shaft and the fixed fluted disk, and the rotating shaft and the fixed fluted disk are engaged with each other. The USB connector includes a bracket, where a hole is opened on the bracket. The rotating shaft casing is fixed in the hole. The rotating shaft is fixedly connected to the data card body. The rotating shaft rotates relative to the fixed fluted disk, and an angle between the data card body and the USB connector is never 180 degrees.

9 Claims, 3 Drawing Sheets

(56) References Cited

U.S. PATENT DOCUMENTS

| | | | |
|---|---|---|---|
| 8,075,318 B2* | 12/2011 | Zhao et al. | 439/13 |
| 8,096,817 B2* | 1/2012 | Lee et al. | 439/104 |
| 8,197,260 B2* | 6/2012 | Wadsworth | 439/27 |
| 8,206,103 B2* | 6/2012 | Sun | 415/213.1 |
| 8,305,288 B2* | 11/2012 | Chen | 343/882 |
| 2004/0229478 A1* | 11/2004 | Chen | 439/11 |
| 2008/0194119 A1* | 8/2008 | Mori | 439/13 |
| 2009/0225486 A1* | 9/2009 | Wadsworth | 361/118 |
| 2013/0344705 A1* | 12/2013 | Mikhnenko | 439/13 |

FOREIGN PATENT DOCUMENTS

| | | |
|---|---|---|
| CN | 201348880 | 11/2009 |
| CN | 201378845 | 1/2010 |
| CN | 201490547 | 5/2010 |
| CN | 201661578 | 12/2010 |
| CN | 201718153 | 1/2011 |

OTHER PUBLICATIONS

International Search Report, dated Sep. 15, 2011, in corresponding International Application No. PCT/CN2011/075436 (6 pp.).

Written Opinion of the International Searching Authority, dated Sep. 15, 2011, in corresponding International Application No. PCT/CN2011/075436 (8 pp.).

* cited by examiner

ROTATABLE DATA CARD

CROSS-REFERENCE TO RELATED APPLICATIONS

This application is a continuation of International Application No. PCT/CN2011/075436, filed on Jun. 8, 2011, which claims priority to Chinese Patent Application No. 201020231187.3, filed on Jun. 11, 2010, both of which are hereby incorporated by reference in their entireties.

FIELD OF THE INVENTION

The present invention relates to the field of communications, and in particular, to a rotatable data card.

BACKGROUND OF THE INVENTION

A data card produces a lot of heat during working. Therefore, heat dissipation must be done to the data card.

In order to improve the heat dissipation effect of the data card, a rotatable data card is designed currently. The rotatable data card includes a USB connector and a data card body. Rotation may be implemented from 0 to 270 degrees for the data card body relative to the USB connector.

During an implementation process of the present invention, the inventor finds that the prior art has at least the following problem:

Since the rotatable data card is used quite casually by the user, sometimes, the data card body may be rotated to be perpendicular to the direction of gravity unintentionally when the data card body is rotated, which may affect the heat dissipation effect of the data card body.

SUMMARY OF THE INVENTION

In order to avoid a case that a data card body is perpendicular to the direction of gravity when the data card body is rotated, an embodiment of the present invention provides a rotatable data card. The technical solution is as follows:

A rotatable data card includes a data card body, a USB connector, and a rotating shaft assembly. The rotating shaft assembly includes a rotating shaft, a fixed fluted disk and a rotating shaft casing. The rotating shaft and the fixed fluted disk are accommodated in the rotating shaft casing. Teeth are set on the rotating shaft and the fixed fluted disk, and the rotating shaft and the fixed fluted disk are engaged with each other.

The USB connector includes a bracket, where a hole is opened on the bracket. The rotating shaft casing is fixed in the hole. The rotating shaft is fixedly connected to the data card body.

The rotating shaft rotates relative to the fixed fluted disk, and an angle between the data card body and the USB connector is never 180 degrees.

Since the teeth are set on the rotating shaft and the fixed fluted disk, the rotating shaft and the fixed fluted disk are accommodated in the rotating shaft casing, the rotating shaft and the fixed fluted disk are engaged with each other, the rotating shaft rotates relative to the fixed fluted disk, the data card body is fixedly connected to the rotating shaft, the rotating shaft casing is fixed in the hole of the USB connector, and the angle between the data card body and the USB connector is never 180 degrees, it is enabled that each time the data card body is rotated, a case that the angle between the data card body and the USB connector is equal to 180 degrees does not appear, that is, a case that the data card body is perpendicular to the direction of gravity does not appear. In this way, the heat dissipation effect of the rotatable data card is relatively good.

Figure 1:
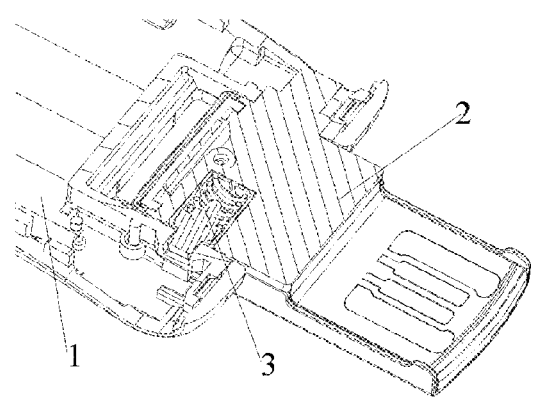
FIG. 1 is a schematic diagram of a rotatable data card according to Embodiment 1 of the present invention.
Figure 2:
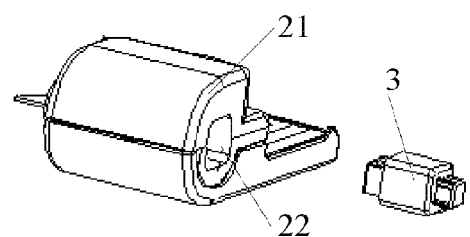
FIG. 2 is a schematic diagram of a bracket of a USB connector according to Embodiment 1 of the present invention.

Meanings of reference numbers in accompanying drawings are as follows:

1: data card body, 2: USB connector, 21: bracket, 22: hole, 3: rotating shaft assembly, 31: rotating shaft, 311: square rotary head, 312: rotatable fluted disk, 313: tail part, 32: fixed fluted disk, 33: rotating shaft casing, 34: elastic component.

DETAILED DESCRIPTION OF THE EMBODIMENTS

To make the objectives, technical solutions, and advantages of the present invention clearer, the implementation manners of the present invention is described in further detail in the following with reference to the accompanying drawings.

Embodiment 1

As shown in FIG. 1, FIG. 2, FIG. 3, FIG. 4, and FIG. 5, an embodiment of the present invention provides a rotatable data card, which includes:

a data card body 1, a USB connector 2, and a rotating shaft assembly 3, where the rotating shaft assembly 3 includes a rotating shaft 31, a fixed fluted disk 32, and a rotating shaft casing 33, the rotating shaft 31 and the fixed fluted disk 32 are accommodated in the rotating shaft casing 33, teeth are set on the rotating shaft 31 and the fixed fluted disk 32, and the rotating shaft 31 and the fixed fluted disk 32 are engaged with each other;

the USB connector 2 includes a bracket 21, where a hole 22 is opened on the bracket 21, the rotating shaft casing 33 is fixed in the hole 22, and the rotating shaft 31 is fixedly connected to the data card body 1; and the rotating shaft 31 rotates relative to the fixed fluted disk 32, and an angle between the data card body 1 and the USB connector 2 is never 180 degrees.

Figure 6:
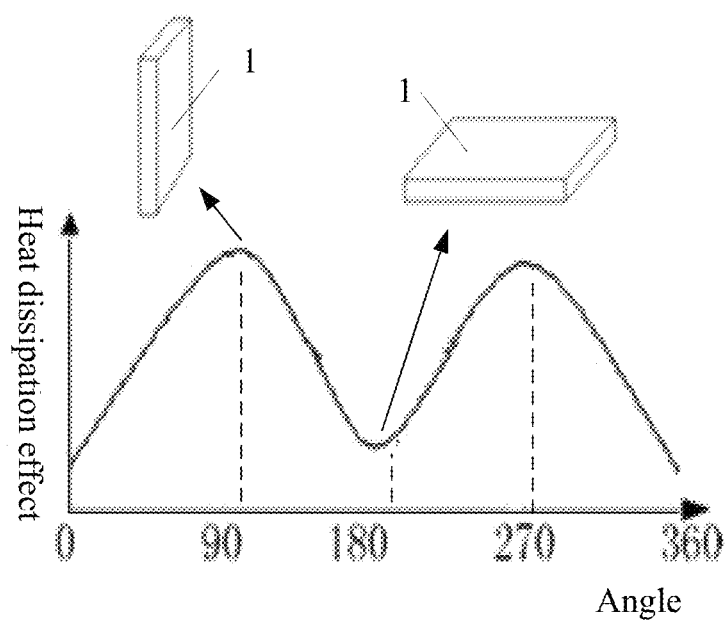
FIG. 6 is a diagram of a changing relationship between an angle which is between a data card body and a USB connector, and a heat dissipation effect according to Embodiment 1 of the present invention.

When the rotatable data card is used, the USB connector 2 is usually in a horizontal plane, and an angle exists between the data card body 1 and the USB connector 2. Referring to FIG. 6, when the angle is in a range from 0 degree to 90 degrees or in a range from 180 degrees to 270 degrees, the greater the angle (that is, the angle between the data card body and the USB connector) is, the smaller an angle between the data card body 1 and the direction of gravity is, and the better a heat dissipation effect of the data card body 1 is; and when the angle is in a range from 90 degrees to 180 degrees or in a range from 270 degrees to 360 degrees, the greater the angle (that is, the angle between the data card body and the USB connector) is, the greater the angle between the data card body 1 and the direction of gravity is, and the worse the heat dissipation effect of the data card body 1 is. When the angle between the data card body 1 and the USB connector 2 is 180 degrees, the data card body 1 is perpendicular to the direction of gravity, in this case, which is the most adverse to the heat dissipation of the data card body 1; and when the angle between the data card body 1 and the USB connector 2 is 90 degrees or 270 degrees, the data card body 1 is parallel to the direction of gravity, and in this case, the heat dissipation effect of the data card body 1 is the best.

In this embodiment, since the angle between the data card body 1 and the USB connector 2 is never 180 degrees, when the data card body 1 is rotated, a case that the angle between the data card body 1 and the USB connector 2 is 180 degrees is impossible to appear, that is, a case that the data card body 1 is perpendicular to the direction of gravity is impossible to appear. In this way, the heat dissipation effect of the rotatable data card is relatively good.

Figure 3:
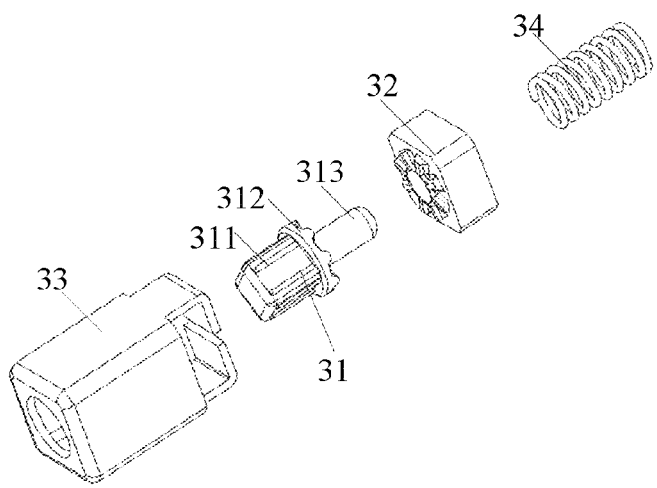
FIG. 3 is an exploded diagram of a rotating shaft according to Embodiment 1 of the present invention.
Figure 4:
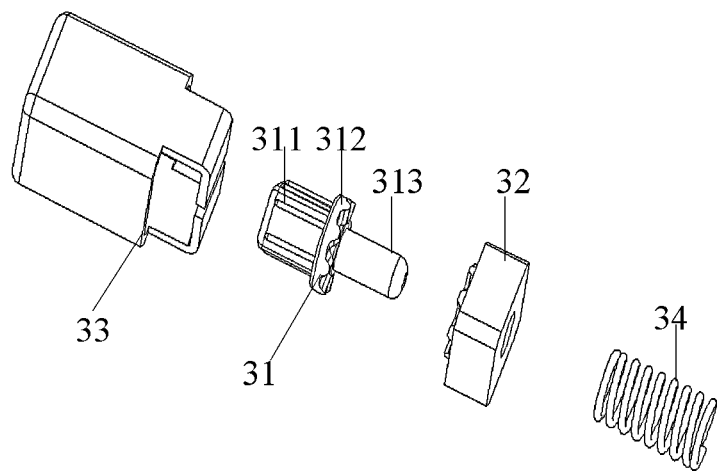
FIG. 4 is another exploded diagram of a rotating shaft according to Embodiment 1 of the present invention.

As shown in FIG. 3 and FIG. 4, the rotating shaft 31 includes a square rotary head 311, a rotatable fluted disk 312, and a tail part 313. Teeth are set in the rotatable fluted disk 312. The tail part 313 is fixed on an end face where the teeth are set and which is of the rotatable fluted disk 312. The square rotary head 311 is fixed on another end face of the rotatable fluted disk 312.

As shown in FIG. 3 and FIG. 4, a round hole is further set in the fixed fluted disk 32.

Figure 5:
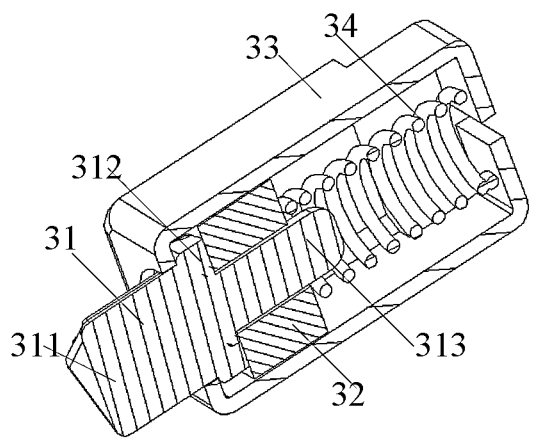
FIG. 5 is a section diagram of a rotating shaft according to Embodiment 1 of the present invention.

As shown in FIG. 5, the tail part 313 of the rotating shaft 31 passes through the round hole of the fixed fluted disk 32, and an end face where the teeth are set and which is of the fixed fluted disk 32 and the end face where the teeth are set and which is of the rotatable fluted disk 312 are engaged with each other through a manner of coordination of the teeth.

A cavity is set within the rotating shaft casing 33, and a round hole is opened on a side of the rotating shaft casing 33. The rotatable fluted disk 312 and the tail part 313 which are of the rotating shaft 31, and the fixed fluted disk 32 are accommodated in the cavity of the rotating shaft casing 33. The square rotary head 311 of the rotating shaft 31 passes through the round hole on the side of the rotating shaft casing 33 and is exposed outside the cavity. In this way, the square rotary head 311 of the rotating shaft 31 can be fixed on the data card body 1.

The rotating shaft 31 and the fixed fluted disk 32 are engaged with each other through the manner of coordination of the teeth, so that the rotating shaft 31 can rotate relative to the fixed fluted disk 32.

Further, as shown in FIG. 3, FIG. 4 and FIG. 5, the rotating shaft assembly 3 also includes an elastic component 34. The elastic component 34 is located in the cavity of the rotating shaft casing 33, and the tail part 313 of the rotating shaft 31 passes through the elastic component 34 and coordinates with the fixed fluted disk 32 to extrude the elastic component 34.

The elastic component 34 may be a spring.

n teeth are set on the rotating shaft 31 and the fixed fluted disk 32, and angles between any two adjacent teeth are the same, where n is an odd number greater than or equal to 3, and the rotating shaft 31 rotates relative to the fixed fluted disk 32 by an angle of $$\frac{2\pi}{n},$$

so that each time the data card body 1 is rotated, the rotating angle of the data card body 1 is $$\frac{2\pi}{n}.$$

When the rotatable data card is in a closed state, the angle between the data card body 1 and the USB connector 2 is 0 degree. If the data card body 1 is started rotating from the closed state, it is assumed that X is the number of rotations (X is greater than or equal to 0 and smaller than or equal to n), a rotating angle of the data card body 1 is $$\frac{2\pi}{n}X$$

degrees. Since n is an odd number greater than or equal to 3, a value of $$\frac{2X}{n}$$

is never equal to 1, that is, the rotating angle of the data card body 1 is never equal to 180 degrees, that also is, the angle between the data card body 1 and the USB connector 2 is never equal to 180 degrees.

For example, 3 teeth are set on the rotating shaft 31 and the fixed fluted disk 32, the rotating shaft 31 rotates relative to the fixed fluted disk 32 by an angle of 120 degrees, and if the data card body 1 is started rotating from the closed state, an angle that the data card body 1 can rotate is 120 degrees, 240 degrees, and 360 degrees, respectively.

For another example, 5 teeth are set on the rotating shaft 31 and the fixed fluted disk 32, the rotating shaft 31 rotates relative to the fixed fluted disk 32 by an angle of 72 degrees, and if the data card body 1 is started rotating from the closed state, an angle that the data card body 1 can rotate is 72 degrees, 144 degrees, 216 degrees, 288 degrees, and 360 degrees, respectively.

When an angle between the data card body 1 and the direction of gravity is smaller than or equal to 60 degrees, comparing with the heat dissipation effect when the data card body 1 is perpendicular to the direction of gravity, the heat dissipation effect of the data card body 1 is greatly improved. When the angle between the data card body 1 and the USB connector 2 is in a range from 30 degrees to 150 degrees or in a range from 210 degrees to 330 degrees, the angle between the data card body 1 and the direction of gravity is smaller than or equal to 60 degrees. Therefore, in order to ensure that the angle between the data card body 1 and the USB connector 2 is in the range from 30 degrees to 150 degrees or in the range from 210 degrees to 330 degrees after every rotation of the data card body 1, the rotating shaft 31 and the fixed fluted disk 32 may be set to having 3 or 5 teeth.

It should be noted that the rotating shaft may also be set at the USB connector, for example, the USB connector includes a bracket, where a hole is opened on the bracket, and the square rotary head of the rotating shaft is set in the hole of the bracket (the shape of the hole may match the shape of the square rotary head); meanwhile, the rotating shaft casing may be set at the data card body, for example, a hole is opened on the data card body (the shape of the hole may match the shape of the rotating shaft casing), and the rotating shaft casing may be set in the hole opened on the data card body, or the rotating shaft casing may be fixed at the data card body through a fixing element. Through these manners, the rotating shaft may also rotate relative to the rotating shaft casing.

In the embodiment of the present invention, since the teeth are set on the rotating shaft and the fixed fluted disk, the rotating shaft and the fixed fluted disk are accommodated in the rotating shaft casing, the rotating shaft and the fixed fluted disk are engaged with each other, the rotating shaft rotates relative to the fixed fluted disk, the data card body is fixedly connected to the rotating shaft, the rotating shaft casing is fixed in the hole of the USB connector, and the angle between the data card body and the USB connector is never 180 degrees, it is enabled that each time the data card body is rotated, a case that the angle between the data card body and the USB connector is equal to 180 degrees does not appear, that is, a case that the data card body is perpendicular to the direction of gravity does not appear. In this way, the heat dissipation effect of the rotatable data card is relatively good.

The foregoing description is only an exemplary embodiment of the present invention and is not intended to limit the present invention. Any modification, equivalent replacement, or improvement made within the spirit and principle of the present invention shall fall within the protection scope of the present invention.

What is claimed is:

1. A rotatable data card, comprising a data card body, a USB connector and a rotating shaft assembly, wherein the rotating shaft assembly comprises a rotating shaft, a fixed fluted disk, and a rotating shaft casing, the rotating shaft and the fixed fluted disk are accommodated in the rotating shaft casing, teeth are set on the rotating shaft and the fixed fluted disk, and the rotating shaft and the fixed fluted disk are engaged with each other;
the USB connector comprises a bracket, wherein a hole is opened on the bracket, the rotating shaft casing is set in the hole, and the rotating shaft is fixedly connected to the data card body; and
the rotating shaft rotates relative to the fixed fluted disk, and an angle between the data card body and the USB connector is never 180 degrees.

2. The rotatable data card according to claim 1, wherein the rotating shaft comprises a square rotary head, a rotatable fluted disk and a tail part; teeth are set on an end face of the rotatable fluted disk, the fixed fluted disk is further set with a round hole, the tail part is fixed on the end face which is with the teeth and is of the rotatable fluted disk, the square rotary head is fixed on another end face of the rotatable fluted disk, the tail part of the rotating shaft passes through the round hole of the fixed fluted disk, and the fixed fluted disk and the rotatable fluted disk of the rotating shaft are engaged with each other through a manner of coordination of the teeth.

3. The rotatable data card according to claim 1, wherein the rotating shaft assembly further comprises an elastic component, the elastic component is located in the rotating shaft casing, and the tail part of the rotating shaft passes through the elastic component and coordinates with the fixed fluted disk to extrude the elastic component.

4. The rotatable data card according to claim 3, wherein the elastic component is a spring.

5. The rotatable data card according to claim 1, wherein a cavity is set within the rotating shaft casing, and a round hole is opened on a side of the rotating shaft casing.

6. The rotatable data card according to claim 5, wherein the rotating shaft passes through the round hole.

7. The rotatable data card according to claim 1, wherein n teeth are set on the rotating shaft and the fixed fluted disk, respectively, and angles between any two adjacent teeth are the same, wherein n is an odd number greater than or equal to 3.

8. The rotatable data card according to claim 7, wherein the rotating shaft rotates relative to the fixed fluted disk by an angle of $$\frac{2\pi}{n}.$$

9. A rotatable data card, comprising a data card body, a USB connector and a rotating shaft assembly, wherein the rotating shaft assembly comprises a rotating shaft, a fixed fluted disk and a rotating shaft casing, the rotating shaft and the fixed fluted disk are accommodated in the rotating shaft casing, teeth are set on the rotating shaft and the fixed fluted disk, and the rotating shaft and the fixed fluted disk are engaged with each other;
the USB connector comprises a bracket, wherein a hole is opened on the bracket, the rotating shaft is set in the hole, and the rotating shaft casing is set at the data card body; and
the rotating shaft rotates relative to the fixed fluted disk, and an angle between the data card body and the USB connector is never 180 degrees.

* * * * *